United States Patent [19]

Vancelette

[11] Patent Number: 4,646,432

[45] Date of Patent: Mar. 3, 1987

[54] PLACEMENT MECHANISM

[75] Inventor: Stanley R. Vancelette, Manchester, N.H.

[73] Assignee: USM Corporation, Flemington, N.J.

[21] Appl. No.: 815,122

[22] Filed: Dec. 30, 1985

Related U.S. Application Data

[63] Continuation of Ser. No. 597,341, Apr. 6, 1984, abandoned.

[51] Int. Cl.⁴ .............................................. B23P 19/00
[52] U.S. Cl. ........................................ 29/743; 29/740
[58] Field of Search ................ 29/739, 740, 743, 270; 81/473, 477, 478, 480; 7/107

[56] References Cited

U.S. PATENT DOCUMENTS

| | | | |
|---|---|---|---|
| 2,661,644 | 8/1953 | Hultquist | 29/270 X |
| 3,861,014 | 1/1975 | Summerlin | 29/270 X |
| 4,151,945 | 5/1979 | Ragard et al. | 29/740 X |
| 4,174,566 | 11/1979 | Smith | 29/740 X |
| 4,206,543 | 6/1980 | Chisholm | 29/739 |
| 4,515,507 | 5/1985 | Asai et al. | 29/740 X |
| 4,527,327 | 7/1985 | Van Deuren | 29/743 X |

FOREIGN PATENT DOCUMENTS

| | | | |
|---|---|---|---|
| 118914 | 1/1942 | Australia | 29/270 |
| 3102206 | 8/1982 | Fed. Rep. of Germany | 29/743 |
| 2126146 | 3/1984 | United Kingdom | 29/270 |

OTHER PUBLICATIONS

IBM Technical Disclosure Bulletin, vol. 24, No. 2, Jul. 1981.

Primary Examiner—Howard N. Goldberg
Assistant Examiner—Joseph M. Gorski
Attorney, Agent, or Firm—Alan N. McCartney

[57] ABSTRACT

A placement mechanism for vertically displacing a micro-electronic component to place the component on a printed circuit board. The mechanism has a spindle that is displaceable on a vertical axis and rotatable on the vertical axis to align the component leads with the lands of the circuit on the board. The spindle carries a placement rod in communication with a vacuum source to enable the component to be retrieved and placed on the board. The placement rod has a resilient interconnection with the spindle to allow for varying board heights and to buffer the impact of the placement of the component on the board.

6 Claims, 3 Drawing Figures

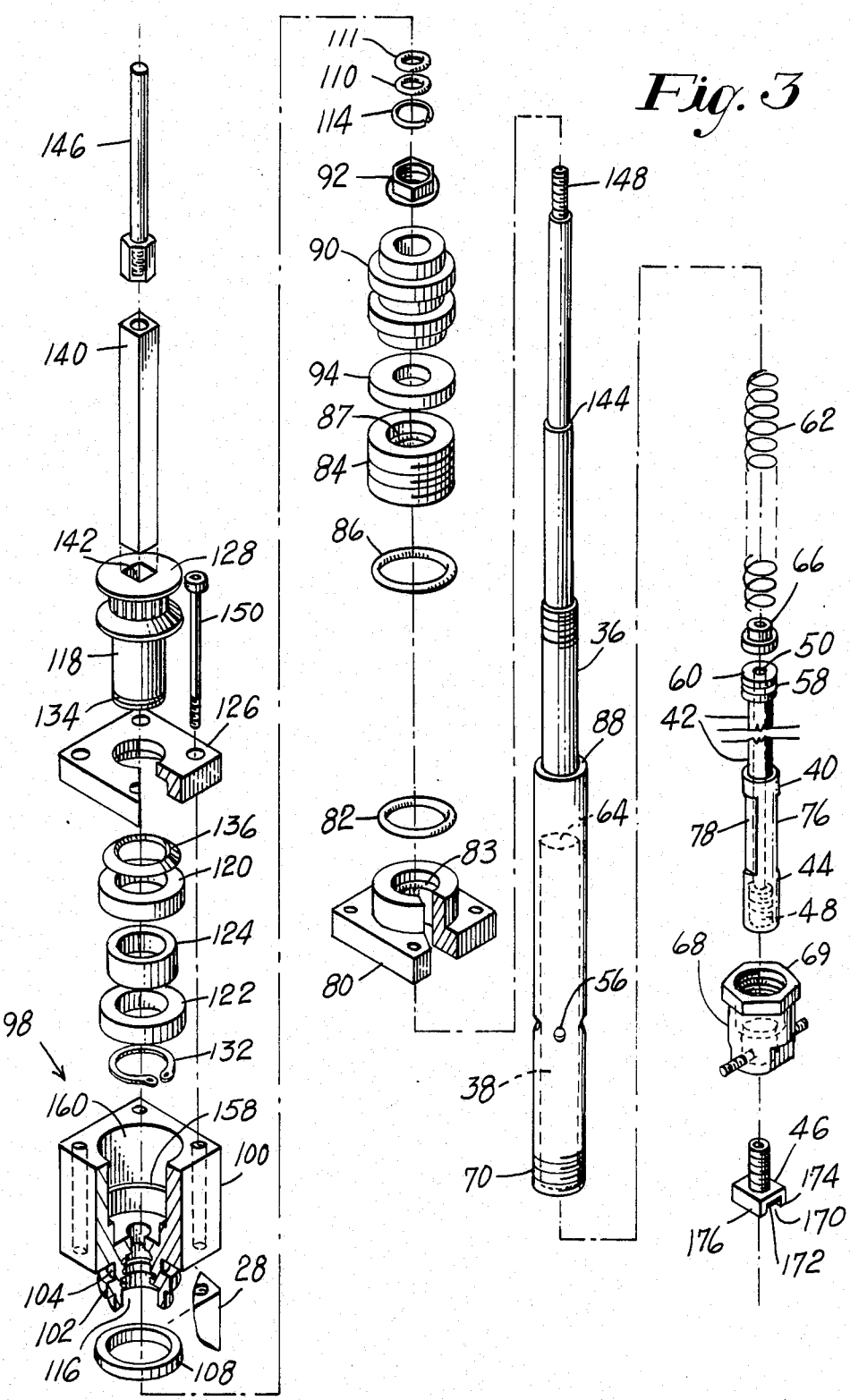

PLACEMENT MECHANISM

This is a continuation of copending Ser. No. 597,341 filed on Apr. 6, 1984 now abandoned.

BACKGROUND OF THE INVENTION (1) Field of the Invention

This invention relates to a mechanism for picking up and placing on a substrate small articles such as micro-electronic components.

(2) Summary of the Prior Art

In the processing of micro-electronic components (chips), the component is obtained from a supply source and transported to a placement head having a placement mechanism which picks up the component and places it on a printed circuit board. In commonly owned U.S. patent application Ser. No. 299,979 filed Sept. 8, 1981 such a component processing apparatus is disclosed. Also disclosed in commonly owned U.S. patent application Ser. No. 565,749 filed Dec. 27, 1983 there is a mechanism for adjusting the position of the placement head for different sized components. In both of the above disclosures, the placement head performs a motion on a vertical axis from the position of receiving the component to positioning the component on the printed circuit board.

There are machines for automatically obtaining chip size components from a supply source and transporting the component to a placement head which positions the component on a printed circuit board. Examples of these machines are illustrated in U.S. Pat. Nos. 4,307,832; 4,327,482; 4,346,514 and 4,393,579. None of these machines have a placement mechanism with a vertical motion on a single axis during which the mechanism picks up the component and moves the component down to the board for positioning between the conductive lands of the circuit on the board. Further, the placement mechanisms are not rotationally positionable on the same axis to align the component with the circuit on the board.

BRIEF SUMMARY OF THE INVENTION

It is the purpose of this invention to provide a placement mechanism that is vertically displaced to receive a micro-electronic component and place the component between the conductive lands on a printed circuit board.

It is also an object of this invention to provide a placement mechanism which can be moved on a single axis vertically from a position to receive a component and place the component on a board and also be rotated on the same vertical axis to align the leads of the component with the conductive lands of the circuit on the board.

It is a further object of this invention to provide in a placement mechanism a housing adapted to be positioned above an article conveyor for receiving an article from the conveyor and placing the same on a substrate. A spindle is mounted in the housing for up and down movement on a verticle axis and is adapted to rotate on that axis to properly align the article with preselected portions of the substrate. A placement rod is mounted in the spindle and has a tip for receiving and holding the article. There is a resilient interconnection between the spindle and the placement rod to buffer the impact of the placement of the article on the substrate and to accommodate variable thicknesses in the substrate. A resilient part of the tip also buffers the impact of the placement of the component on the board. The rod and tip have a central opening which when subjected to a vacuum will retain the article on the tip and when subjected to an air blast will release the article from the tip onto the substrate.

BRIEF DESCRIPTION OF THE DRAWINGS

FIG. 3 is an exploded view of the placement mechanism of this invention.

DESCRIPTION OF THE PREFERRED EMBODIMENT

Figure 1:
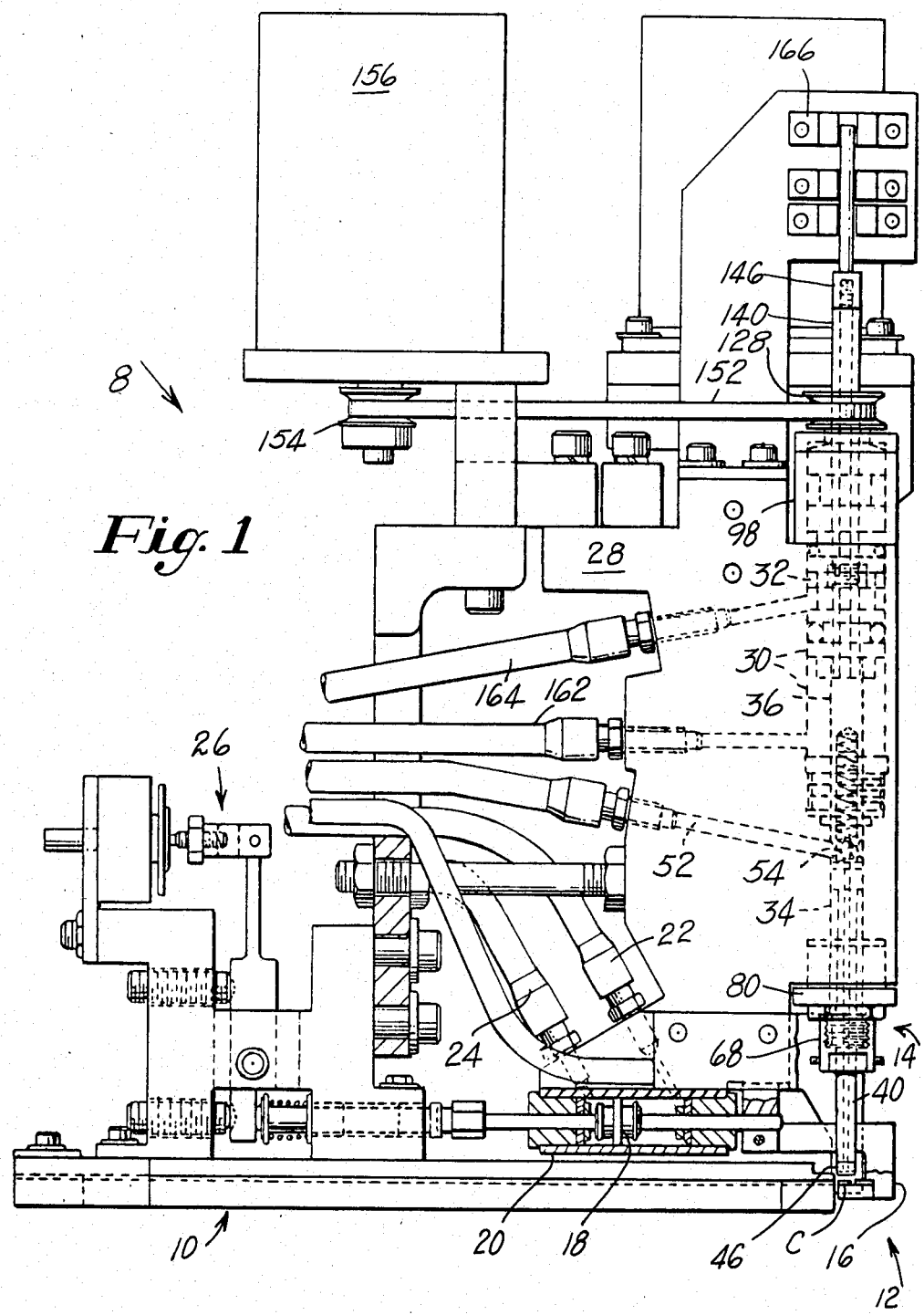
FIG. 1 is a side elevational view of the placement head.

The micro-electronic component assembly machine in which the placement mechanism of this invention is utilized is the type disclosed in commonly owned U.S. patent application Ser. No. 299,979 filed Sept. 8, 1981. That component assembly machine utilizes an air conveyor to transport a component from a supply source to apparatus receiving the component beneath the placement head which positions the component on the board. In that disclosure and the disclosure of commonly owned U.S. patent application Ser. No. 565,749 filed Dec. 27, 1983 the component receiving means is adjustable in position to accommodate various sizes of components to center the component in the placement head to assure the component leads are placed on the conductive lands of the circuit on the board. The disclosures of both the aforementioned prior applications are incorporated herein by reference.

In the component placement machine illustrated, a placement head 8 comprises an air conveyor 10 which transports the component (c) from a supply source (not shown) to a receiving means 12 positioned below the placement mechanism 14. The receiving means 12 comprises an adjustable shelf 16 positioned by a piston 18 in a cylinder 20. The air in line 22 will move the piston 18 to position the shelf 16 inward underneath the placement mechanism 14 so that the component (c) in the shelf 16 can be picked up by the placement mechanism 14. Thereafter, air in line 24 will move the piston 18 to the right to move the shelf 16 outward to permit the placement mechanism to move toward the board (not shown) to place the component on the board. A stop mechanism 26 controls the rearward movement of the piston 18 to control the position of the shelf 16 underneath the placement mechanism.

The placement mechanism 14 is carried in a housing 28 supported on the machine support (not shown). The housing 28 has a stepped bore 30 having an upper portion 32 and a lower portion 34. A spindle 36 is carried in the bore 30 and has a lower opening 38 carrying a placement rod 40. The placement rod 40 has an upper area 42 received within the opening 38 and a lower area 44 into which a tip or nozzle 46 is threaded at 48. An opening 50 passes through the placement rod 40 and communicates with the interior of opening 38. A vacuum line 52 is attached at 54 to the lower bore 34 and provides vacuum to the nozzle 46 through openings 56 in the spindle 36. A seal 58 surrounds the end 60 of placement rod 40. The rod 40 is normally biased downward by a spring 62 positioned between the end 64 of opening 38 and a plug 66. A collar 68 is threaded around the end 70 of the spindle 36 and has set screws 72, 74 which ride against the flattened sides 76, 78 of the placement rod 40 to prevent rotation of the placement rod 40 in the spindle 36 for reasons that will become apparent hereafter. The position of the collar 68 on the spindle 36 will adjust the spacing of the tip 46 from the shelf 16. The collar 68 is locked on spindle 36 by lock nut 69 to vertically position the tip 46 from the shelf 16. A bearing gland 80 and seal 82 are positioned around the spindle 36 to seal the lower bore 34 and provide the lower bearing surface for the spindle 36. An additional seal 83 surrounds the spindle 36. In the operation of the placement mechanism thus far described, vacuum in the placement rod will retain a component on the nozzle 46. As a component is placed on the board, the spring 62 acting against the end of the placement rod 40 through plug 66 and will allow for varying board heights and buffer the impact of the placement of the component on the board.

Figure 2:
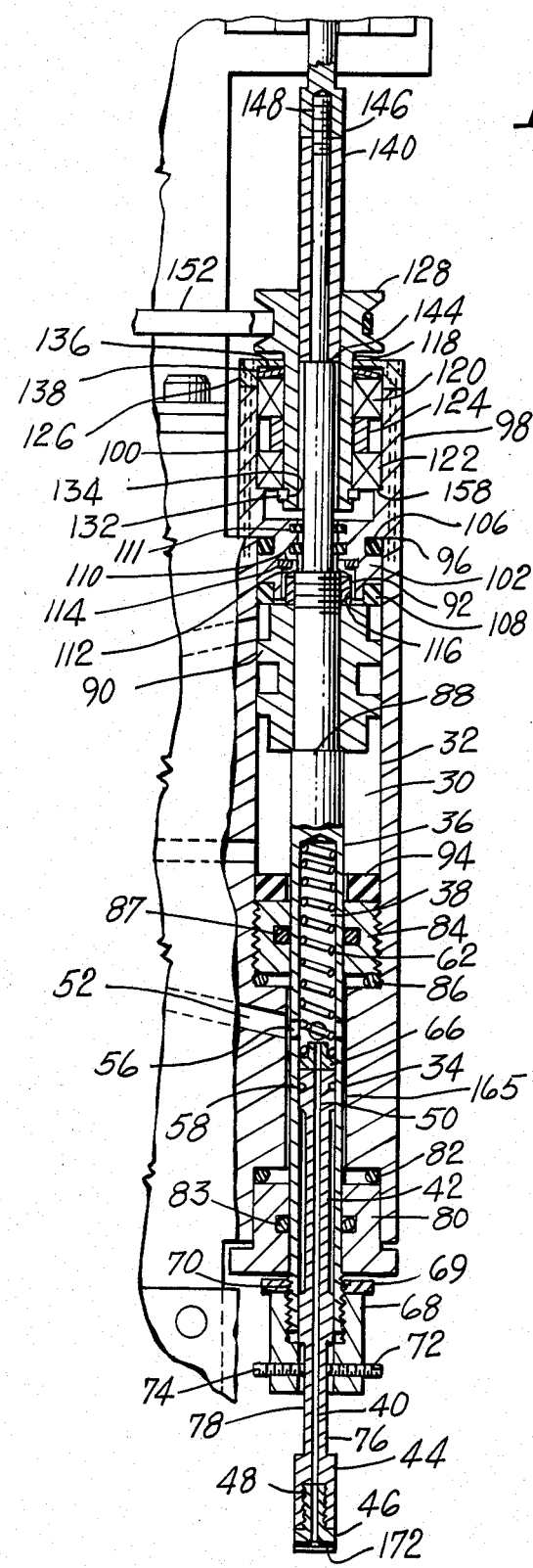
FIG. 2 is a sectional view of the placement mechanism of this invention.

Attention is now directed to FIGS. 1 and 2 which illustrate the portion of the placement mechanism which lowers the placement rod 40 so that after a component is removed from the shelf 16, the component can be lowered to a position on the board. An insert 84 and seal 86 are located in the upper bore 32 to isolate the upper and lower portions of bore 30. An additional seal 87 surrounds the spindle 36. Positioned against the shoulder 88 of spindle 36 is a piston 90. The piston 90 is retained on the spindle 36 by a nut 92. A resilient bumper 94 surrounds the spindle 36 between the piston 90 and the insert 84 to soften the impact of the piston 90 against the insert 84.

The top 96 of the upper bore 32 in the housing 28 is enclosed by a cap assembly 98 which permits the spindle 36 to be moved up and down in the housing during the placement of the component on the board. The cap assembly 98 also permits the spindle 36 to be rotated so that the leads of the component (C) carried on nozzle 46 can be aligned with the lands of the circuit on the board.

The cap assembly 98 comprises a cup 100 having a bottom portion 102 extending into the top 96 of the upper bore 32. An annular groove 104 surrounds the bottom portion 102 and contains a seal 106, to seal the bore 32. The spindle 36 is mounted through a bearing 111 and a seal 110 in the opening 112 in the bottom portion 102 of the cap assembly 98. The seal 110 is retained in opening 112 by a snap ring 114. The bottom portion 102 also has a recess 116 to accommodate the nut 92 when the piston 90 is in the upper position. A bumper 108 surrounds the bottom portion 102 to soften the impact of the piston 90 against the cap assembly 98.

A collar 118 is mounted in bearings 120, 122 which are separated by a spacer 124. A cap 126 is positioned between the bearing 120 and a pulley 128 intregal with the collar 118. A snap ring 132 in annular groove 134 retains the bearings 120, 122 and spacer 124 on collar 118. Cap 126 is attached through cup 100 to housing 28 with screws 150. A spring washer 136 is positioned between the bearing 120 and the cap 126 in recess 138 to preload bearings 120, 122 for the purpose of removing bearing clearance which will give collar 118 a more precise and stable rotating motion.

A square rod 140 is positioned in the opening 142 in collar 118 and rests on the shoulder 144 on the spindle 36. An extension 146 is threaded onto the end 148 of spindle 36 and secures the rod 140 to the spindle. The square opening 142 in the collar 118 through which the rod 140 is positioned permits the pulley 128 to rotate the spindle 36 while the spindle is reciprocating. The pulley 128 is driven by a belt 152 carried on a drive pulley 154 of motor 156. The motor 156, in response to programmed control, rotates the spindle 36 and thus placement rod 40 to align the component held on the end of the placement rod with the desired location on the board.

The cap 126 and cap assembly 98 are assembled to the housing 28 by screws 150. In the assembled condition (FIG. 2) the bearing 122 rests against the shoulder 158 in opening 160 of the cup 100.

In operation, after the vacuum tip 46 picks the component from the shelf 16 and the shelf 16 moves forward, air in line 164 will lower the piston 90 and thus spindle 36 to permit the placement rod to lower the component onto the printed circuit board. With the resilient interconnection between the spindle and placement rod varying thickness of the substrate are accommodated.

Since there is a clearance 165 around the spindle 36 in the lower bore 34, the vacuum will continue to hold the component on the nozzle 46. Also, at the time the component reaches the board, the vacuum in line 52 will be relieved and an air blast in line 52 will release the component from the tip or nozzle 46 onto the board.

Thereafter, air in line 162 will raise the spindle 36 and the shelf 16 will move inward to receive another component so that the tip 46 can pick another component from shelf 16. Further, during this placement sequence, the rotational mounting of the spindle permits the component to be aligned to assure that the component leads are properly placed on the lands of the circuit on the board.

The extension 146 on spindle 36 coacts with the switches 166 on the housing 28 to give an indication of the position of the spindle 36.

Attention is also directed to the fact that the nozzle 46 has a recess or groove 170 into which the chip type component nests. The groove 170 has an energy absorbing material 172 to help buffer the impact of the placement of the component on the board. Further, the component is held between the sides 174, 176 of the groove 170 when the spindle 36 is rotated during the alignment of the component with the circuit on the board.

It can thus be seen with the use of a spindle rotatably mounted in the placement head housing and movable toward and away from the board, a component can be properly aligned with the circuit and easily and accurately placed on the board. Further, with the placement rod slidably mounted in the spindle, the component can be placed on uneven board surfaces with no damage to the component.

I claim:

1. A placement mechanism for orienting and positioning an electrical component on a substrate, comprising:
   a. a housing adapted to be supported above the substrate and including a cylindrical opening;
   b. a spindle rotatably mounted in said opening about a vertical axis said spindle having a lower end portion slidably receiving a placement rod that receives a component and places the component on the substrate;
   c. a piston surrounding said spindle and carried in said opening, and movable in response to a fluid medium to move said spindle toward and away from said substrate along said vertical axis;
   e. means interconnecting said spindle and said rod, comprising a collar on said spindle and set screws threaded into said collar, said set screws being engageable with flat sides on said rod to maintain said spindle and said rod in axial alignment, and said collar being adjustably threaded onto said spindle to permit vertical adjustment of said rod relative to said spindle along said vertical axis;

f. means resiliently interconnecting said spindle and said rod to cushion impact of the placement of the component onto the substrate and accommodate substrates of different thickness; and g. means for rotating said spindle and said rod to orient the component prior to its being positioned on the substrate.

2. The placement mechanism of claim 1 wherein said placement rod has a tip adapted to hole the component, a central opening in said rod and said tip when subjected to vacuum will retain the component on said tip and when subjected to air pressure will release the component from said tip onto the substrate.

3. The placement mechanism of claim 2 wherein said tip includes means to confine the component during rotational movement of said spindle and buffer the positioning of the component on the substrate.

4. The placement mechanism of claim 1 wherein said spindle has an upper end, and a cap assembly is mounted in an end of the bore in said housing with the upper end of said spindle being rotatably mounted in said cap assembly.

5. The placement mechanism of claim 4 wherein said cap assembly includes a cup member sealed in said end of said bore and supporting said spindle mounting.

6. The placement mechanism of claim 5 wherein said spindle supports a driven pulley.

* * * * *